(12) United States Patent
Bryant et al.

(10) Patent No.: US 6,870,225 B2
(45) Date of Patent: Mar. 22, 2005

(54) TRANSISTOR STRUCTURE WITH THICK RECESSED SOURCE/DRAIN STRUCTURES AND FABRICATION PROCESS OF SAME

(75) Inventors: Andres Bryant, Essex Junction, VT (US); Mark D. Jaffe, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 118 days.

(21) Appl. No.: 09/682,957

(22) Filed: Nov. 2, 2001

(65) Prior Publication Data

US 2003/0085424 A1 May 8, 2003

(51) Int. Cl.[7] .......................... H01L 27/01; H01L 27/12; H01L 31/0392
(52) U.S. Cl. ..................... 257/347; 257/410; 257/411; 257/637; 257/638; 257/640
(58) Field of Search ................................. 257/347, 410, 257/411, 637, 638, 640, 344, 623; 438/269, 300

(56) References Cited

U.S. PATENT DOCUMENTS

| | | |
|---|---|---|
| 3,332,137 A | 7/1967 | Kenney |
| 4,403,396 A | 9/1983 | Stein |

(List continued on next page.)

FOREIGN PATENT DOCUMENTS

| | | |
|---|---|---|
| EP | 19910100837 | 8/1991 |
| JP | 19880157923 | 1/1990 |
| JP | 19880285130 | 5/1990 |
| JP | 19890027999 | 8/1990 |
| JP | 19900195813 | 3/1992 |
| JP | 19910325834 | 6/1993 |
| JP | 19940030832 | 8/1995 |
| JP | 19950221758 | 3/1997 |

OTHER PUBLICATIONS

IBM Technical Disclosure Bulletin, vol. 25, No. 8, Jan. 1983, pp. 4065–4066, Recessed Source and Drain Gallium Arsenide MESFET, T.L. Andrade.

*Primary Examiner*—Amir Zarabian
*Assistant Examiner*—Monica Lewis
(74) *Attorney, Agent, or Firm*—Schmeiser, Olsen & Watts; William D. Sabo

(57) ABSTRACT

An improved transistor structure that decreases source/drain (S/D) resistance without increasing gate-to-S/D capacitance, thereby increasing device operation. S/D structures are formed into recesses formed on a semiconductor wafer through a semiconductor layer and a first layer of a buried insulator having at least two layers. A body is formed from the semiconductor layer situated between the recesses, and the body comprises a top body surface and a bottom body surface that define a body thickness. Top portions of the S/D structures are within and abut the body thickness. An improved method for forming the improved transistor structure is also described and comprises: forming recesses through a semiconductor layer and a first layer of a buried insulator so that a body is situated between the recesses; and forming S/D structures into the recesses so that top portions of the S/D structures are within and abut a body thickness.

11 Claims, 13 Drawing Sheets

U.S. PATENT DOCUMENTS

| | | | |
|---|---|---|---|
| 5,047,356 A | | 9/1991 | Li et al. |
| 5,116,771 A | | 5/1992 | Karulkar |
| 5,140,390 A | | 8/1992 | Li et al. |
| 5,208,472 A | * | 5/1993 | Su et al. .................. 257/344 |
| 5,374,329 A | | 12/1994 | Miyawaki |
| 5,418,391 A | | 5/1995 | Huang |
| 5,426,315 A | * | 6/1995 | Pfiester ..................... 257/66 |
| 5,449,932 A | | 9/1995 | Fujii |
| 5,461,250 A | * | 10/1995 | Burghartz et al. ........ 257/347 |
| 5,539,228 A | | 7/1996 | Chi |
| 5,571,738 A | | 11/1996 | Krivokapic |
| 5,705,840 A | | 1/1998 | Shen et al. |
| 5,736,435 A | | 4/1998 | Venkatesan et al. |
| 5,798,291 A | | 8/1998 | Lee et al. |
| 5,828,103 A | | 10/1998 | Hsu |
| 5,880,499 A | | 3/1999 | Oyama |
| 5,908,313 A | * | 6/1999 | Chau et al. ............... 438/299 |
| 5,994,747 A | * | 11/1999 | Wu .......................... 257/408 |
| 6,045,625 A | * | 4/2000 | Houston .................. 148/33.3 |
| 6,066,532 A | | 5/2000 | Chen et al. |
| 6,071,783 A | * | 6/2000 | Liang et al. .............. 438/301 |
| 6,121,077 A | | 9/2000 | Hu et al. |
| 6,188,105 B1 | | 2/2001 | Kocon et al. |
| 6,225,173 B1 | * | 5/2001 | Yu ............................ 438/301 |
| 6,274,913 B1 | * | 8/2001 | Brigham et al. .......... 257/368 |
| 6,380,010 B2 | * | 4/2002 | Brigham et al. .......... 438/161 |
| 6,383,849 B1 | * | 5/2002 | Choi ......................... 438/151 |
| 6,420,218 B1 | * | 7/2002 | Yu ............................ 438/142 |
| 6,437,404 B1 | * | 8/2002 | Xiang et al. .............. 257/347 |
| 6,579,750 B1 | * | 6/2003 | Krivokapic ............... 438/149 |
| 6,593,192 B2 | * | 7/2003 | Zahurak et al. ........... 438/283 |
| 2001/0036693 A1 | * | 11/2001 | Brigham et al. .......... 438/183 |
| 2002/0168823 A1 | * | 11/2002 | Tseng ....................... 438/282 |

\* cited by examiner

TRANSISTOR STRUCTURE WITH THICK RECESSED SOURCE/DRAIN STRUCTURES AND FABRICATION PROCESS OF SAME

BACKGROUND OF THE INVENTION

1. Technical Field

The present invention relates generally to the field of semiconductor processing and, more specifically, to a fabrication process for a transistor structure with thick recessed source/drain (S/D) structures.

2. Background Art

The need to remain cost and performance competitive in the production of semiconductor devices has caused continually increasing device density in integrated circuits. To facilitate the increase in device density, new technologies are constantly needed to allow the feature size of these semiconductor devices to be reduced.

The push for ever increasing device densities is particularly strong in CMOS technologies, such as the in the design and fabrication of field effect transistors (FETs). FETs are the basic electrical devices of today's integrated circuits and are used in almost all types of integrated circuit design (i.e., microprocessors, memory, etc.). FETs may be formed on conventional substrates such as a silicon wafer. For example, a conventional CMOS FET formed on a silicon wafer may include a gate oxide layer formed on the wafer, a gate formed on the gate oxide layer, spacers formed beside the gate on the gate oxide layer, and doped S/D regions arranged on respective sides of a gate conductor. The gate is separated from a channel (which is situated between the source and drain regions) by the gate oxide layer. Shallow trench insulator (STI), local oxidation of silicon (LOCOS), or poly-buffered LOCOS isolations are usually employed to provide for isolation of adjacent transistors.

Unfortunately, increased device density in FETs often results in degradation of performance and/or reliability. One type of FET that has been proposed to facilitate increased device density is a double gated FET (fin FET). Fin FETs use two gates, one on each side of a fin structure, to facilitate scaling of CMOS dimensions for example, while maintaining an acceptable performance. In particular, the use of the double gate increases gate area, which allows the fin FET to have higher current, without increasing the lateral dimensions of the device.

Additionally, with increased device density in FETs, it is difficult to improve various performances of semiconductor devices using a bulk wafer. Semiconductor devices are made with thinner layers that have more abrupt transitions between the layers. Therefore, semiconductor devices using a silicon-on-insulator (SOI) wafer will play a greater role in device structuring in the future. Conventional SOI construction methods involve the formation of silicon devices on a thin film of single crystalline silicon material separated from a wafer of silicon material by a layer of buried oxide (BOX).

However, a good, low resistant contact from the source/drain regions to the channel in a thin SOI film are difficult to make. Conventional methods attempt to solve this problem by raising the source/drain (S/D) regions on either side of the transistor resulting in low S/D resistance. However, this in turn increases the capacitance between the gate and the S/D regions because of the close proximity of the S/D contact to the gate (e.g. S/D silicon abutting the sides of the gate). Therefore, this increase in gate-to-S/D capacitance leads to a decrease in device performance. This is one of the limiting factors for SOI device performance.

Thus, there is a need for improved transistor structures and methods of fabrication of transistor structures that provide transistors with S/D regions that provide low S/D resistance without increasing gate-to-S/D capacitance.

DISCLOSURE OF INVENTION

In contrast to previous generations of field effect transistors (FETs), the present invention provides improved transistor structures with thick recessed source/drain (S/D) structures without any complex device engineering. The thick recessed S/D structures decrease S/D resistance (i.e., increase S/D conductivity) without increasing gate-to-S/D capacitance, thereby increasing device operation.

In association with one embodiment of present invention, a FET structure comprises thick S/D structures with S/D regions thereon formed into recesses to facilitate lowering the S/D structures in order to decrease S/D resistance. The recesses are formed on a semiconductor wafer through a semiconductor layer and a first layer of a buried insulator having at least two layers. A body is formed from the semiconductor layer situated between the recesses, and the body comprises a top body surface and a bottom body surface that define a body thickness. Top portions of the source and drain structures are within and abut the body thickness.

In association with another embodiment of present invention, a fin FET structure comprises thick S/D structures with S/D regions thereon formed into recesses to facilitate lowering the S/D structures in order to decrease S/D resistance. The recesses are formed on a semiconductor wafer through a semiconductor layer and a first layer of a buried insulator having at least two layers. A fin structure is formed from the semiconductor layer situated between the recesses, and the fin structure comprises a top fin structure surface and a bottom fin structure surface that define a fin structure thickness. Top portions of the source and drain structures are within and abut the fin structure thickness.

The present invention also provides improved fabrication methods for forming improved transistor structures with thick recessed S/D structures. In association with one embodiment of present invention, a method is disclosed wherein a FET structure with thick recessed S/D structures is formed. The method comprises: providing a semiconductor wafer having a semiconductor layer overlying a buried insulator having at least two layers; forming a first recess and a second recess through the semiconductor layer and a first layer of the buried insulator; forming a body from the semiconductor layer situated between the first recess and the second recess so that a top body surface and a bottom body surface define a body thickness; and forming a source structure having a source region into the first recess and forming a drain structure having a drain region into the second recess so that a top portion of the source structure and a top portion of the drain structure are within and abut the body thickness.

In association with another embodiment of present invention, a method is disclosed, wherein a fin FET structure with thick recessed S/D structures is formed. The method comprises: providing a semiconductor wafer having a semiconductor layer overlying a buried insulator having at least two layers; forming a first recess and a second recess through the semiconductor layer and a first layer of the buried insulator; forming a fin structure from the semiconductor layer situated between the first recess and the second recess so that a top fin structure surface and a bottom fin structure surface define a fin structure thickness; and forming a source structure having a source region into the first recess and forming a drain structure having a drain region into the second recess so that a top portion of the source structure and a top portion of the drain structure are within and abut the fin structure thickness.

The foregoing and other advantages and features of the invention will be apparent from the following more particular description of the invention, as illustrated in the accompanying drawings.

BRIEF DESCRIPTION OF THE SEVERAL VIEWS OF THE DRAWINGS

Embodiments of the present invention will hereinafter be described in conjunction with the appended drawings, where like designations denote like elements.

DETAILED DESCRIPTION OF THE INVENTION

Figure 1:
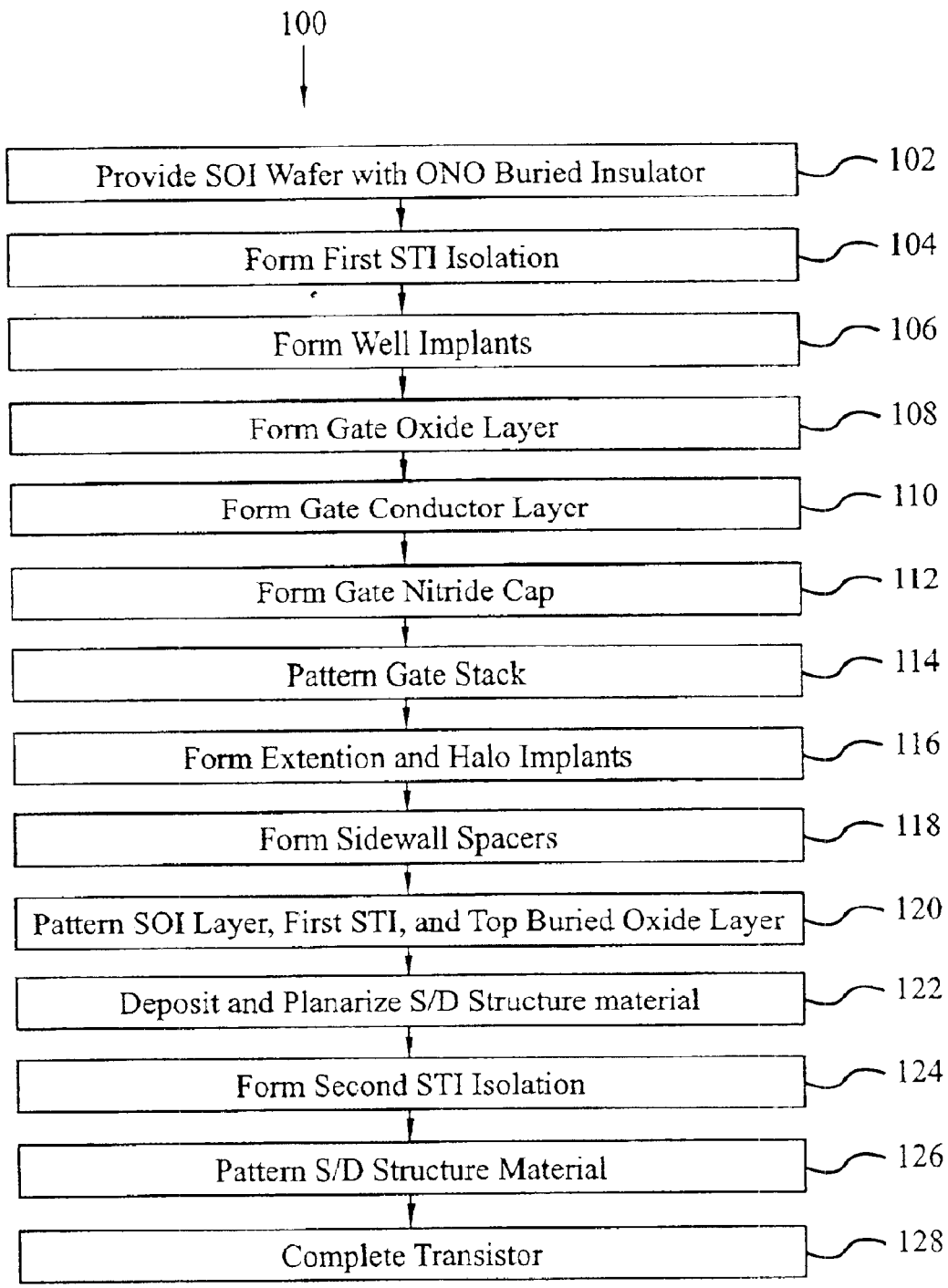
FIG. 1 is a flow diagram illustrating a fabrication method of the invention.

The present invention may be readily adapted to a variety of methods of fabricating a transistor structure with thick recessed source/drain (S/D) structures that decrease S/D resistance without increasing gate-to-S/D capacitance, thereby increasing device operation. The present invention relates to any type of field effect transistor (FET), such as, for example, metal oxide semiconductor (MOS) FETs, complimentary metal oxide semiconductor (CMOS) FETs, n-channel metal oxide semiconductor (NMOS) FETs, p-channel metal oxide semiconductor (PMOS) FETs, and the like. Moreover, it will be understood by one of ordinary skill in the art that the invention is not limited to the specific structures illustrated in the drawings or to the specific steps detailed herein. It will also be understood that the invention is not limited to use of any specific dopant types provided that the dopant types selected for the various components are consistent with the intended electrical operation of the device.

Turning now to FIG. 1, a method 100 for forming a transistor structure with thick recessed S/D structures in accordance with an embodiment of the present invention is illustrated. FIGS. 2–7 are cross-sectional views depicting various stages during method 100. Generally, method 100 of the present invention may form a transistor structure with thick recessed S/D structures by: providing a semiconductor wafer having a semiconductor layer overlying a buried insulator having at least two layers; forming recesses through the semiconductor layer and a first layer of the buried insulator; forming a body from the semiconductor layer situated between the recesses so that a top body surface and a bottom body surface define a body thickness; and forming S/D structures having S/D regions thereon into the recesses so that top portions of the S/D structures are within and abut the body thickness. Thus, method 100 forms a transistor structure with thick recessed S/D structures in a manner that decreases S/D resistance without increasing gate-to-S/D capacitance, thereby increasing device performance.

Figure 3:
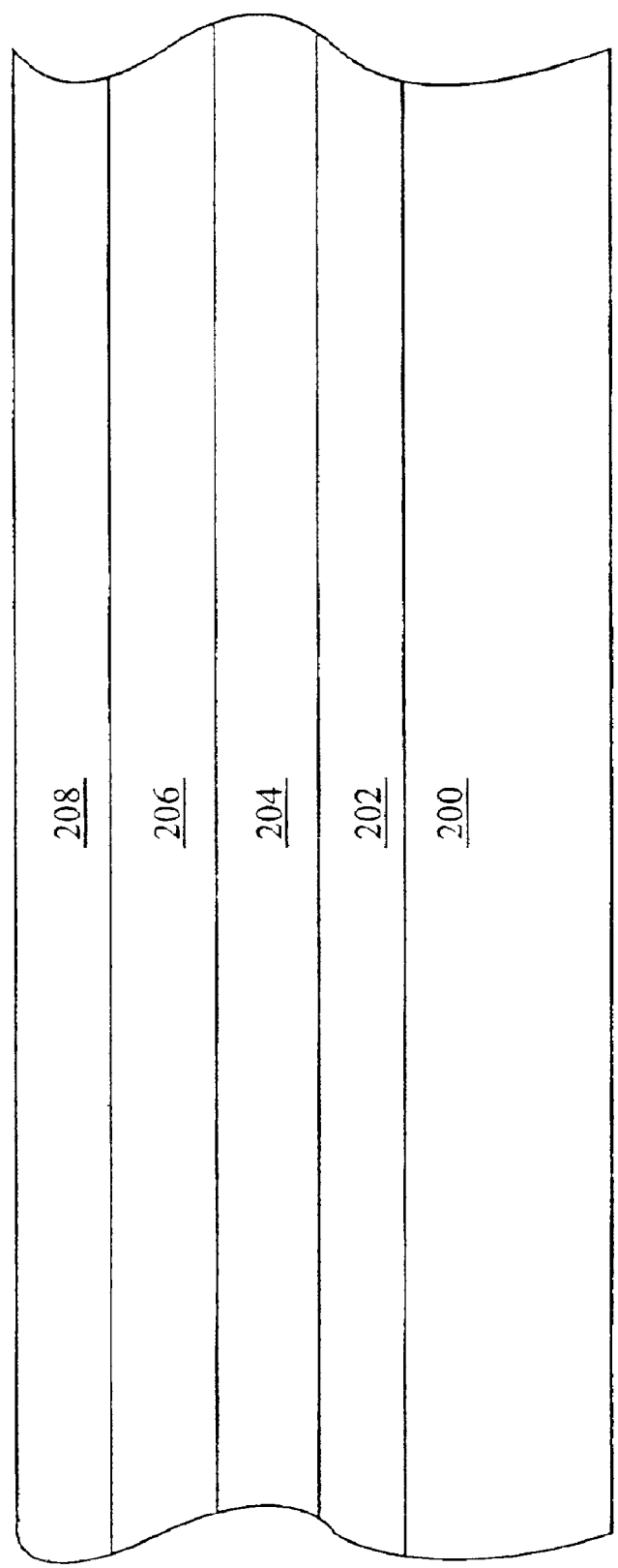

Referring to FIG. 3, step 102 in method 100 is to provide wafer 200 with a semiconductor layer 208 overlying a buried insulator having at least two layers, in contrast to conventional SOI construction techniques that provide only oxide as the buried insulator. Semiconductor layer 208 may comprises any conductive material, such as silicon or single crystal silicon. For the exemplary purposes of this disclosure, semiconductor layer 208 comprises a silicon on insulator (SOI) layer. The at least two layers of the buried insulator may be different from one another. Additionally, the first layer of the buried insulator may be at least as thick as semiconductor layer 208. The buried insulator having at least two layers may also comprise three layers. The three layers of the buried insulator may be different from one another as well. Alternatively, the second layer of the buried insulator may be different from both the first layer and the third layer of the buried insulator. For the exemplary purposes of this disclosure, the three layers of the buried insulator may comprise top first oxide layer 206, an intermediate second nitride layer 204, and bottom third oxide layer 202 (an ONO buried insulator). However, any type and/or combination of buried insulator layers may be used for the buried insulator provided such layers have the necessary bonding, interfacing, or etch stop properties. Wafer 200 with semiconductor layer 208 overlying oxide layer 206, nitride layer 204, and oxide layer 202 may be made by any known method, but for the exemplary purposes of this disclosure it may be made in the bond an cleave method.

Figure 2:
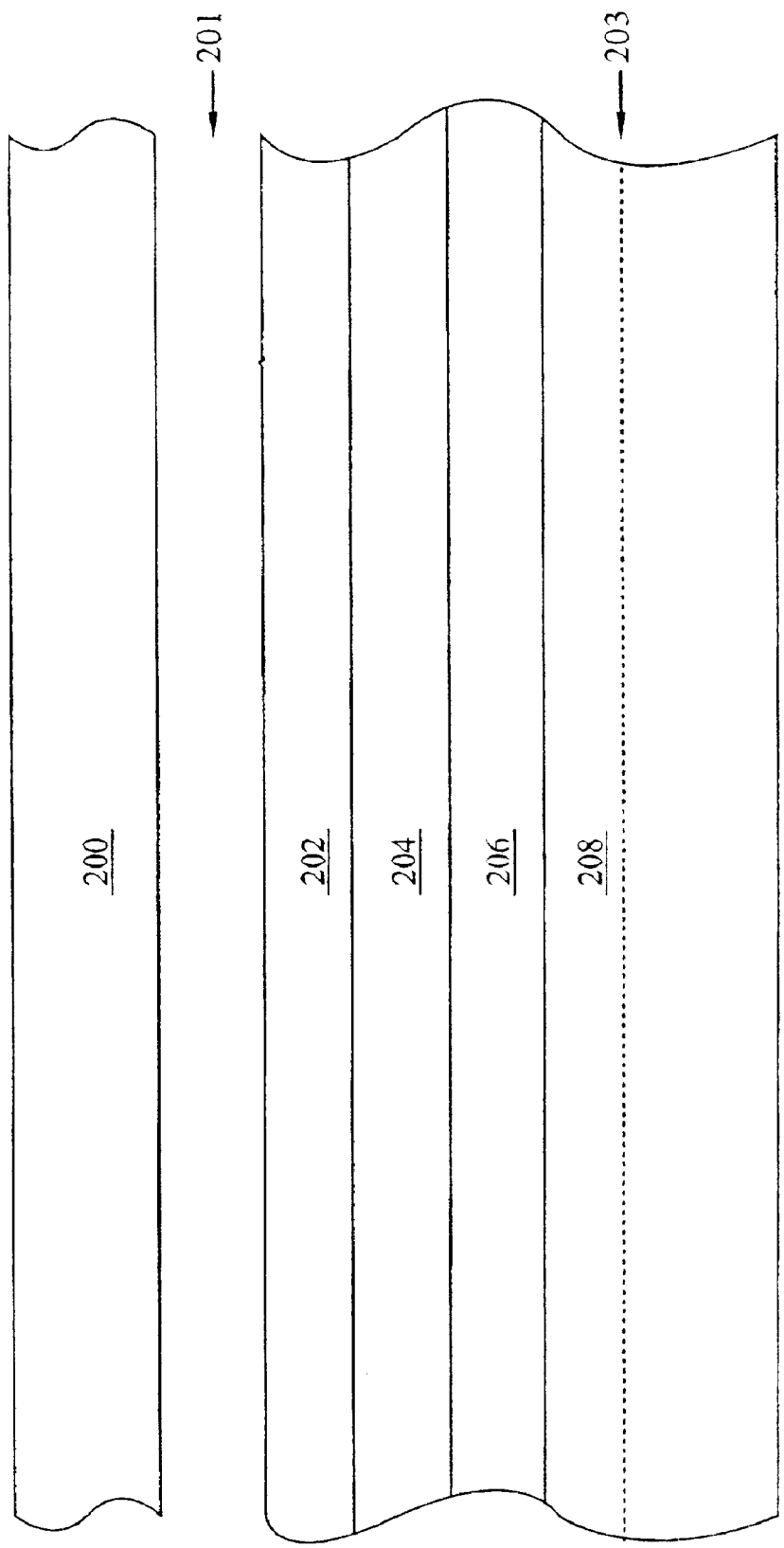
FIGS. 2–7 are cross-sectional side views of an embodiment of a transistor structure of the invention with thick recessed S/D structures during the fabrication method of FIG. 1.

Referring to FIG. 2 specifically, a seed wafer is ion implanted with hydrogen so as to form hydrogen implant region 203. Oxide layer 206 may then be formed on the seed wafer using thermal oxidation, such as rapid-thermal processing (RTP) or furnace processing for example, or other techniques known in the art. Oxide layer 206 may be silicon dioxide, and is between 5 nm–100 nm thick. As described previously, oxide layer 206 may be at least as thick as resulting semiconductor layer 208 described more fully below.

Overlaid on oxide layer 206 may be nitride layer 204. Nitride layer 204 may be silicon nitride, and is between 10 nm–50 nm thick. Notwithstanding, nitride layer 204 may comprise any other insulative material with the proper mechanical properties. A chemical vapor deposition (CVD) process, a high temperature low pressure CVD (LPCVD) process or other deposition techniques known in the art, including plasma enhanced CVD (PECVD), or sputtering, for example, all may be used to deposit nitride layer 204.

Overlaid on nitride layer 204 may be oxide layer 202. Oxide layer 202 may be formed on nitride layer 204 using thermal oxidation, such as rapid-thermal processing (RTP) or furnace processing for example, or other techniques known in the art. Oxide layer 202 may be silicon dioxide, and is between 5 nm–50 nm thick. Thus, as will be made clear, oxide layer 202 is to facilitate bonding, nitride layer 204 is to act as an etch stop in the formation of recessed S/D structures 220, and the recessed S/D structures 220 are to be formed in oxide layer 206, thereby providing for thick recessed S/D structures 220 and resulting in the low S/D resistance.

The seed wafer is then bonded to wafer 200 ("handle" wafer) at bonding interface 201. Bonding may be by any technique known in the art. For the exemplary purposes of this disclosure, the seed wafer may be bonded to wafer 200 along oxide layer 202 by heating the wafers to a temperature of about 1225Å° C. and pressing them together with a pressure of about 2000 p.s.i. for about one minute. Alternatively, the seed wafer may be bonded to wafer 200 along oxide layer 202 by a glass bond, as by using a borosilicate, lead silicate, or phosphosilicate glass as a bonding agent. Bonded layers provide a semiconductor layer 208 of the best available crystal defect quality. The bonding heat treatment causes the seed wafer to cleave along hydrogen implant region 203. Finally, upon flipping the bonded wafers over, a polishing step is performed to smooth the cleaved semiconductor layer 208 surface, leaving semiconductor layer 208 with a thickness between 40 nm–100 nm thick. Thus, wafer 200 with semiconductor layer 208 overlying oxide layer 206, nitride layer 204, and oxide layer 202 remains as depicted in FIG. 3.

Figure 4:
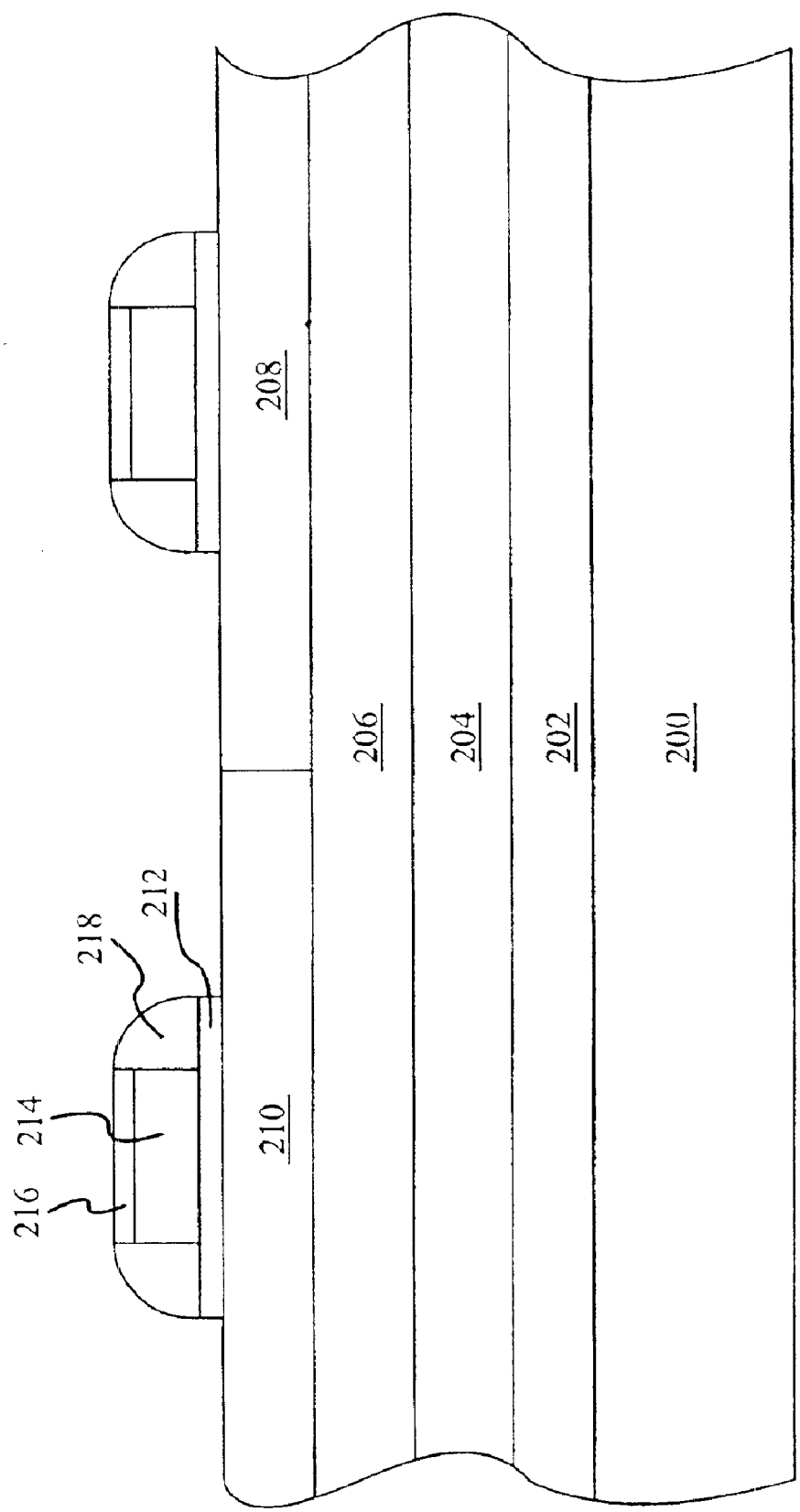

Referring to FIG. 4, step 104 of method 100 is to form first shallow trench insulator (STI) isolations in relevant portions of semiconductor layer 208. STI isolations are typically used in MOS and CMOS technology to provide for isolation between adjacent transistors, as well as define active areas. Step 104 may comprise any of the available traditional STI formation techniques. Thus, trenches may be formed through semiconductor layer 208. In forming trenches, conventional photolithography and etch techniques may be used to expose part of the surface of first buried oxide layer 206 under semiconductor layer 208. The depth of the trenches may be determined based on the thickness of semiconductor layer 208 among other variables.

The trenches may then be filled with a suited STI 210, such as oxide. A high-density plasma chemical vapor deposition (HDP-CVD) technique may be used to generate HDP oxide for filling the trenches. Nevertheless, other techniques may be used for filling the trenches, such as CVD or PECVD for example. Alternatively, tetra ethyl ortho silicate (TEOS) oxide may be used to fill the trenches, or any other suitable fill material may be used, as long a sufficient isolation of adjacent transistors and definition of active areas are guaranteed. After trenches are filled with STI 210, a planarization process such as resist etch back (REB), reactive ion etch (RIE), or, typically, chemical mechanical polishing (CMP) may be used to remove excess STI 210 to acquire a more planar surface along semiconductor layer 208.

According to step 106 of method 100, a sacrificial oxide layer, such as a clean oxide layer, may be formed over semiconductor layer 208 by any technique known in the art to isolate the element formation regions from each other. An ion implantation technique may then be executed to dope semiconductor layer 208 so as to form P-well structures and/or N-well structures. In CMOS technology, P-well structures and N-well structures are formed to allow the integration of NMOS and PMOS transistors in a common wafer. Well suited for N-type doping are: P, As and Sb, for example. Well suited for P-type doping are: B, In and Ga, for example. The sacrificial oxide layer may then be stripped away by any technique known in the art.

Still referring to FIG. 4 and according to step 108, by thermally oxidizing semiconductor layer 208, gate oxide layer 212 which will form the gate insulating layer, may be formed on semiconductor layer 208. Gate oxide layer 212 may typically be a silicon oxide layer, although other appropriate materials may be used. For example, gate oxide layer 212 may be formed as a composite layer of CVD oxide and thermal oxide, or of a nitrided oxide material, as known in the art. In addition, gate oxide layer 212 may be formed as a composite layer of silicon oxide and silicon nitride, or formed of one of the high dielectric materials or combinations thereof.

In step 110 of method 100, gate conductor layer 214 may be formed overlying gate oxide layer 212 as also depicted in FIG. 4. Gate conductor layer 214 may be any suitable conducting material, typically a polycrystalline silicon material, although amorphous silicon, a combination of amorphous silicon and polysilicon or any other appropriate material may be used to form gate conductor layer 214. In addition, in some embodiments of the present invention, it might be advantageous to employ a metal gate conductor layer 214, such as tungsten (W), molybdenum (Mo) or tantalum (Ta), or alternatively, a silicided gate conductor comprising polysilicon added with nickel (Ni) or cobalt (Co). Where gate conductor layer 214 encompass a silicon material, such layers may be deposited as a doped layer (in-situ doping). Where gate conductor layer 214 is a metal layer, such layers may be deposited using physical vapor or chemical vapor deposition methods or any other technique known in the art.

In step 112 of method 100, a nitride layer is formed over gate conductor layer 214 and patterned, forming a nitride cap 216 for patterning the gate stack. According to step 114 of method 100, layers 212 and 214 may be patterned and structured using well known photolithography and etching techniques to form gate stacks, i.e, using nitride cap 216 as an etch block during an etching of layers 212 and 214.

In step 116 of method 100, extension and halo implants are formed. For NMOS FETs, typically B is used for the halo implants with a suitable energy and dose. For PMOS FETs, typically As is used for the halo implants with a suitable energy and dose.

In step 118 of method 100, sidewall spacers 218 may be formed. In some embodiments, a dielectric material may be deposited as a blanket dielectric layer and may be anisotropically etched to form spacers 218. The dielectric material selected may be a CVD or PECVD nitride material. In some embodiments, materials other than nitride and/or a combination of materials is employed.

Figure 5:
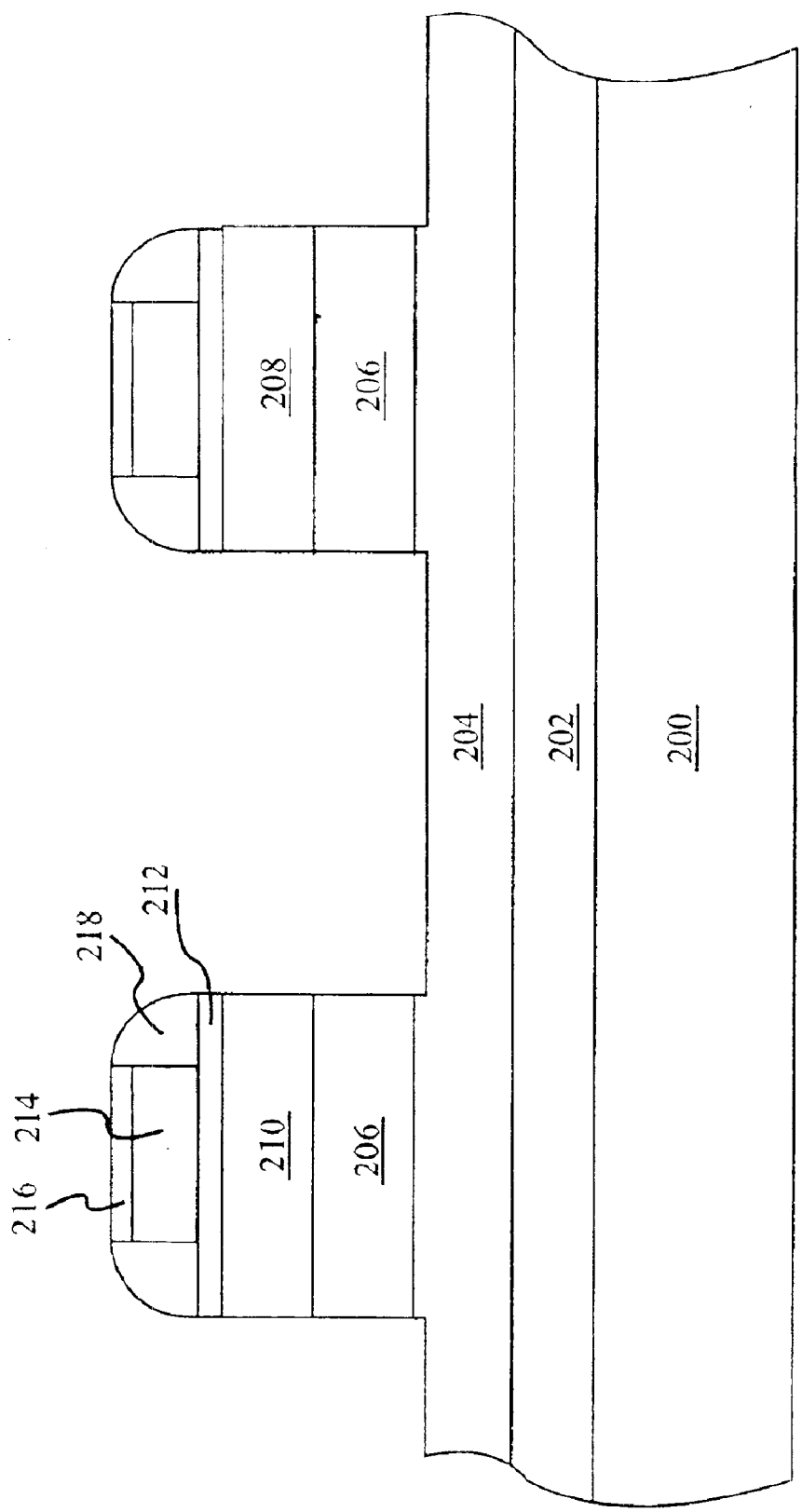
Figure 6:
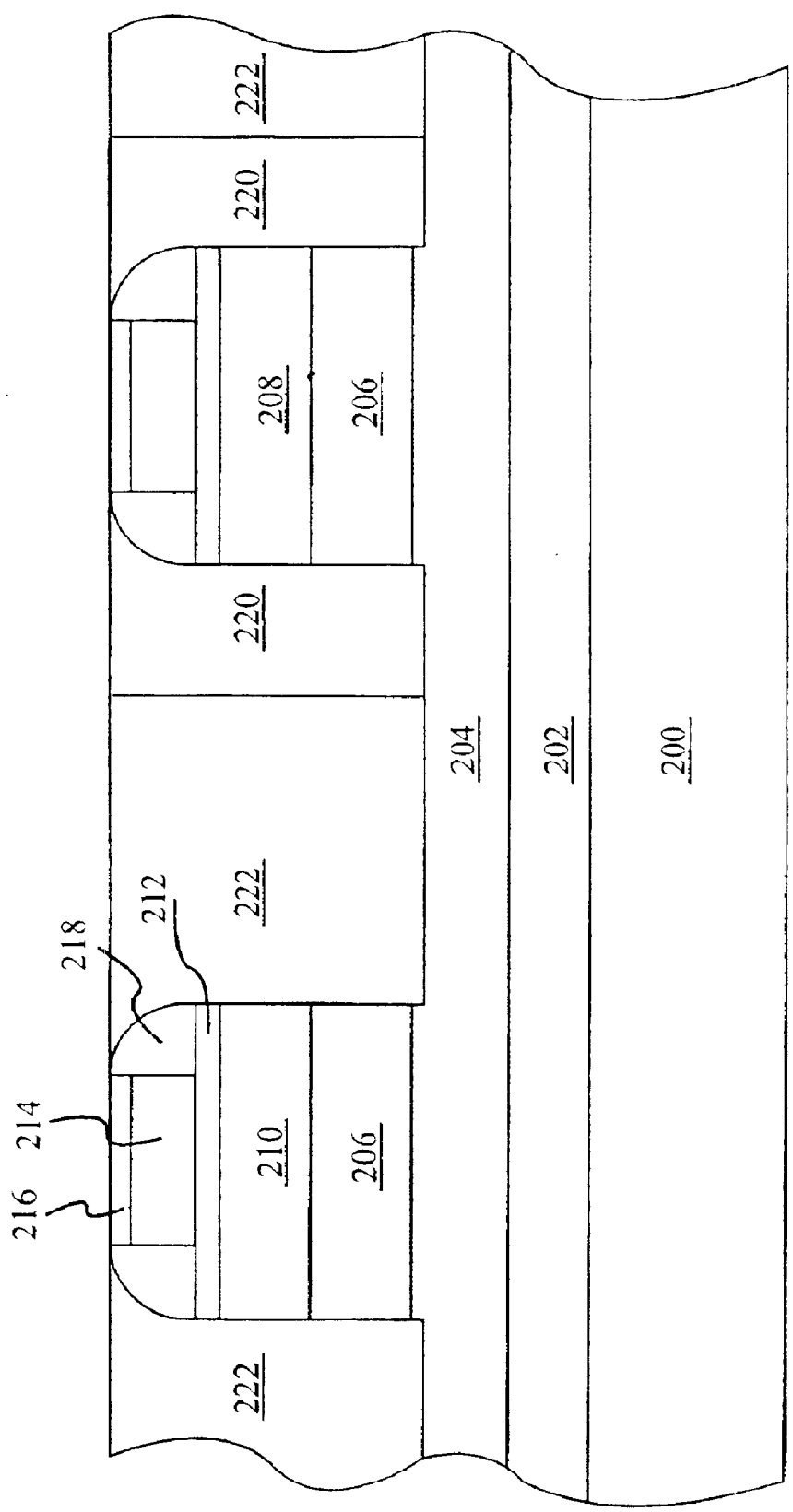
Figure 7:
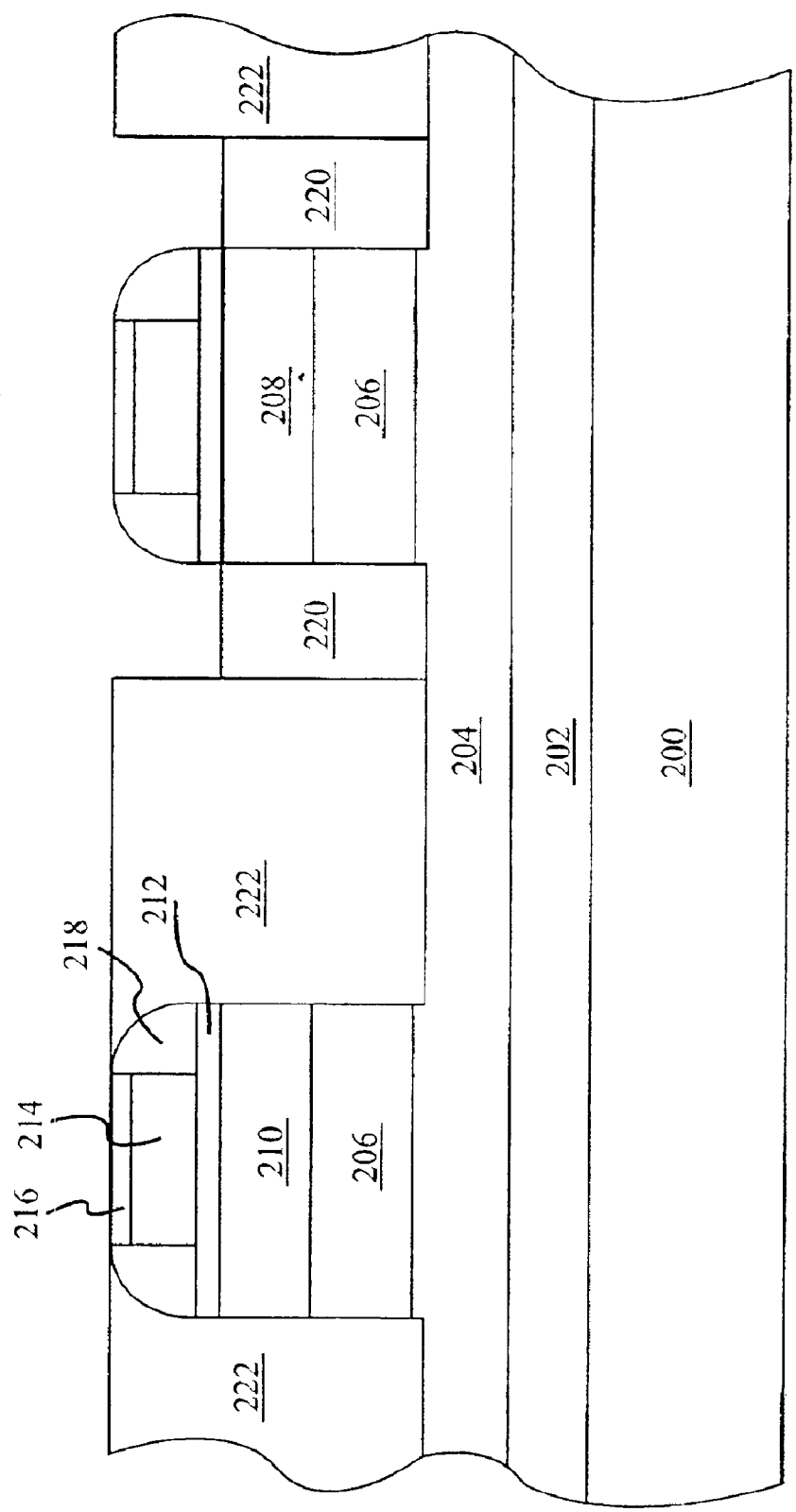

Turning to FIGS. 5–7, thick S/D structures 220 may be formed recessed below opposite sides of the gate stack. Referring particularly to FIG. 5 and according to step 120, an un-masked etch selective to nitride is performed that etches through semiconductor layer 208, STI 210, and oxide layer 206. Accordingly, the etch may stop on nitride layer 204. Nitride cap 216 protects the gate stack during this etch. In this manner, recesses for the S/D structures 220 are formed in the semiconductor layer 208, thereby forming a transistor body from a portion of the semiconductor layer 208 situated between the recesses so that a top body surface and a bottom body surface define a body thickness. Referring particularly to FIG. 6 and according to step 122, S/D structure 220 material, such as polysilicon, is then deposited and planarized with the top of the gate stack.

Still referring to FIG. 6, in next step 124, second STI isolations are formed. Step 124 may comprise any of the available traditional STI formation techniques. Accordingly, trenches may be formed through S/D structure 220 material. In forming trenches, the S/D mask and etch techniques may be used to expose part of the surface of nitride layer 204 under S/D structure 220 material. The trenches may then be filled with a suited STI 222, such as TEOS oxide or any other suitable fill material, as long a sufficient isolation of adjacent transistors and definition of active areas are guaranteed. After trenches are filled with STI 222, a planarization process such as REB, RIE, or, typically, CMP may be used to remove excess STI 222 to acquire a more planar surface along the top of the gate stack.

Referring particularly to FIG. 7 and according to step 126, S/D structure 220 material is patterned with a timed REI etch for example. In one embodiment of the invention, top portions of S/D structures 220 are recessed at least below gate conductor layer 214 while abutting semiconductor layer 208 in order to make an electrical connection to a channel region, such as planar with or below gate oxide layer 212. In another embodiment of the invention, top portions of S/D structures 220 are recessed to within the thickness of semiconductor layer 208 situated between the recesses (i.e., the transistor body thickness) while abutting semiconductor layer 208 (i.e. the transistor body) in order to make an electrical connection to a channel region. In these manners (i.e., by not building up S/D structure 220 material above gate oxide layer 212), step 126 of method 100 decreases S/D resistance without increasing gate-to-S/D capacitance, thereby increasing device operation. In contrast, conventional methods raise S/D regions on either side of the transistor resulting in increased gate-to-S/D capacitance because of the close proximity of the S/D contact to the gate (e.g. S/D silicon abutting the sides of the gate), which in turn leads to a decrease in device performance.

Thus, in FIG. 7, an embodiment of the present invention is depicted having a minimum of complexity. This depicted embodiment of the present invention is at a stage of a process flow technique modified by a fabrication method of the present invention for forming a transistor structure with thick recessed S/D structures 220. Particularly in this embodiment, semiconductor wafer 200 is depicted with an overlying oxide layer 202. On top of oxide layer 202 is nitride layer 204. Overlying a relevant portion of nitride layer 204 is oxide layer 206. On top of oxide layer 206 is semiconductor layer 208 (i.e. the transistor body), which underlies a gate stack comprising gate oxide layer 212, gate conductor layer 214 overlying gate oxide layer 212, and a nitride cap 216 overlying gate conductor layer 214. Side wall spacers 218 are adjacent the gate stack. Recesses are fanned through semiconductor layer 208 and oxide layer 206 stopping on nitride layer 204 so that semiconductor layer 208 and the gate stack are situated between the recesses. STI isolations comprising STI 222 and S/D structures 220 are formed into the recesses and therefore the S/D structures 220 are at least as thick as a combination of the semiconductor layer 208 and oxide layer 206. S/D structures 220 are formed into the recesses to facilitate lowering the S/D regions in order to decrease S/D resistance. Accordingly, top portions of S/D structures 220 are recessed below gate oxide layer 212 within the thickness of semiconductor layer 208 situated between the recesses and abutting semiconductor layer 208.

The transistor structure of FIG. 7 with thick recessed S/D structures 220 may be completed according to step 128 of method 100. Accordingly, S/D regions may be formed on S/D structures 220 respectively and may define a channel region in semiconductor layer 208 underlying the gate stack (i.e., the transistor body) and situated between S/D structures 220. Formation of the S/D regions may be accomplished using any of the variety of methods that have been developed to form S/D regions and that are tailored for specific performance requirements. There are many such methods for forming S/D regions having various levels of complexity. Thus, in some embodiments of the present invention, lightly doped S/D regions may be formed, while in other embodiments, other S/D regions may be formed, such as by ion implantation. Notwithstanding the method used to form the S/D regions, where semiconductor layer 208 encompasses a P-type well structure, S/D structures 220 are doped N-type. Alternatively, where semiconductor layer 208 encompasses an N-type well region, S/D structures 220 are doped P-type. Thus, for NMOS FETs, typically As is used for the S/D implants with a suitable energy and dose. For PMOS FETs, typically B is used for the S/D implants with a suitable energy and dose.

Continuing with step 128, an inter metal dielectric is deposited and planarized typically using a CMP process. Contact holes are structured and etched using an anisotropic RIE process or the like. The contact holes are filled using any conducting material, such as doped polysilicon, silicide (WSi), metals (Au, Al, Mo, W, Ta, Ti, Cu, or ITO (indium-tin oxide)), or the like, being deposited by evaporation and etching, or other techniques, thereby forming S/D contacts. Then the first metal layer is deposited and structured using a RIE process or the like. Alternatively, the structuring of the first metal layer could be done following a damacene process flow.

Figure 8:
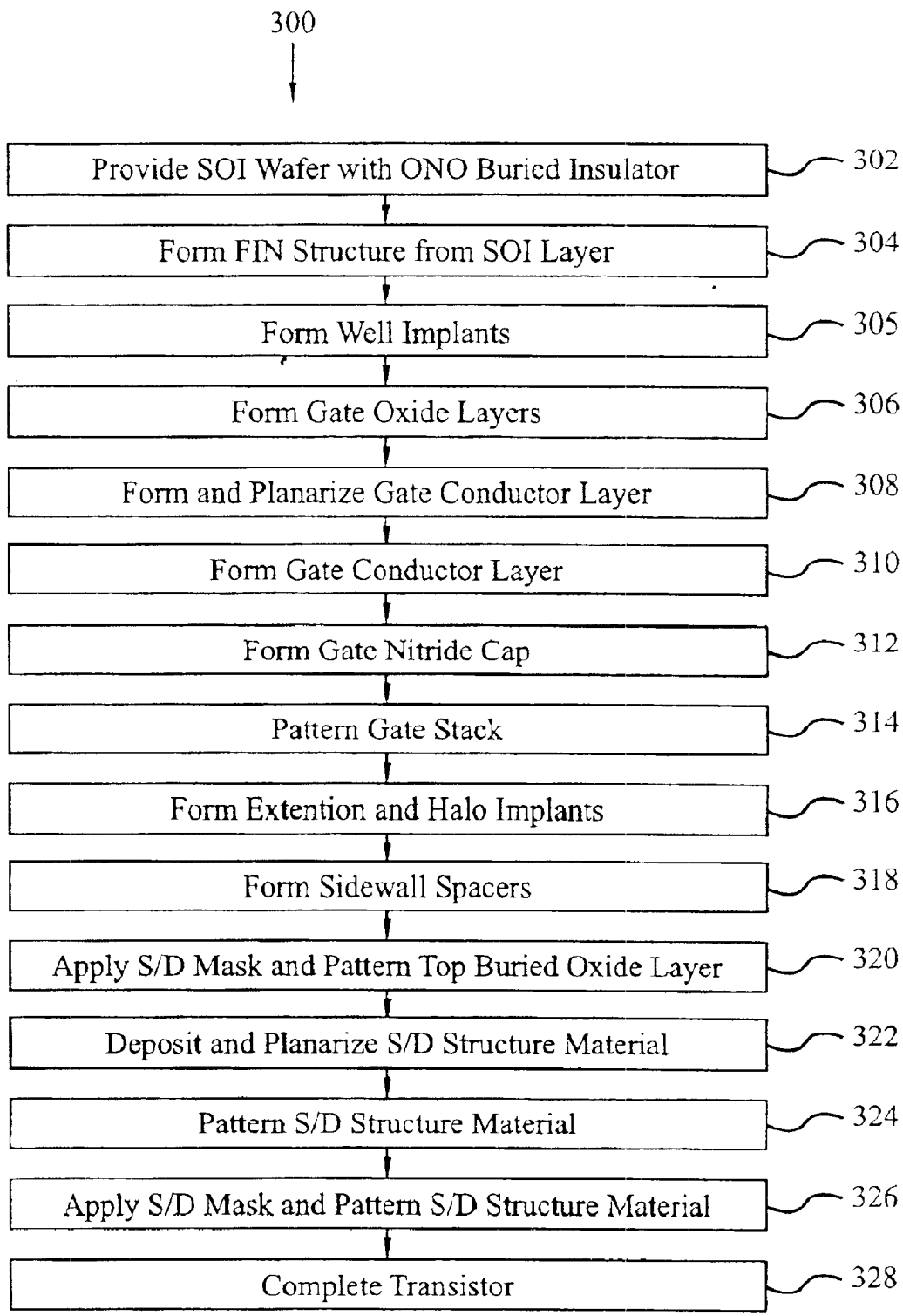
FIG. 8 is a flow diagram illustrating another fabrication method of the invention.

Turning now to FIG. 8, a method 300 for forming a fin transistor structure with thick recessed S/D structures in accordance with the present invention is illustrated. FIGS. 9–12 are cross-sectional views depicting various stages during method 300. Generally, fabrication method 300 of present invention may form a double gated (fin) transistor structure with thick recessed S/D structures by: providing a semiconductor wafer having a semiconductor layer overlying a buried insulator having at least two layers; forming recesses through the semiconductor layer and a first layer of the buried insulator; forming a fin structure from the semiconductor layer situated between the recesses so that a top fin structure surface and a bottom fin structure surface define a fin structure thickness; and forming S/D structures having S/D regions into the recesses so that top portions of the S/D structures are within and abut the fin structure thickness. Thus, method 300 forms a fin transistor structure with thick recessed S/D structures in a manner that decreases S/D resistance without increasing gate-to-S/D capacitance, thereby increasing device operation.

Step 302 of method 300 is to provide wafer 200 with an at least two layered buried insulator beneath semiconductor layer 208, step 302 being identical to step 102 of method 100 as previously described in conjunction with FIGS. 2–3. Thus, for the exemplary purposes of the disclosure, semiconductor layer 208 comprises a SOI layer, and the at least two layered buried insulator comprises an ONO buried insulator, namely top oxide layer 206, nitride layer 204, and bottom oxide layer 202.

Figure 9:
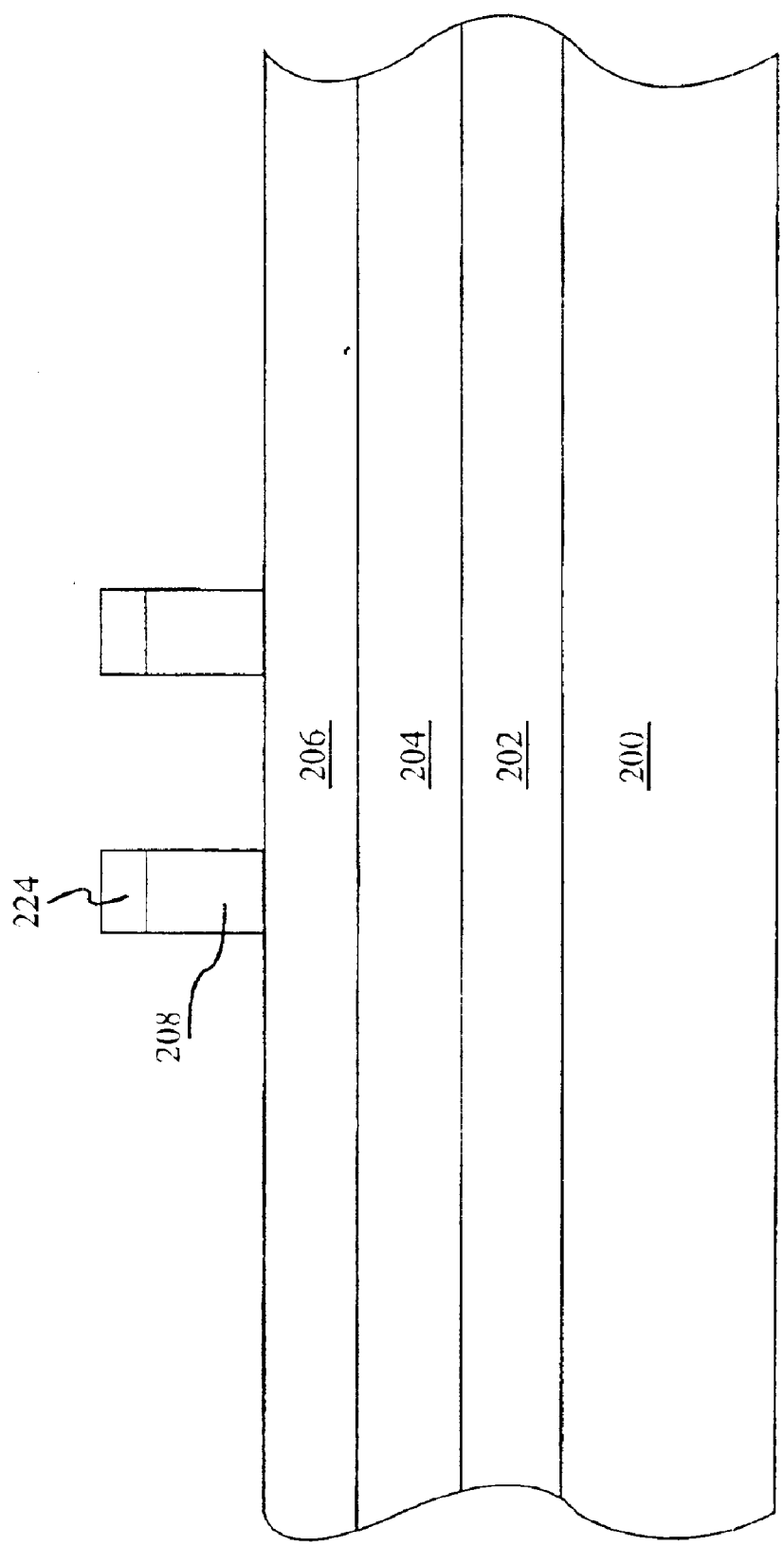
FIGS. 9–12 are cross-sectional side views of an embodiment of a fin transistor structure of the invention with thick recessed S/D structures during the fabrication method of FIG. 8.

The next step 304 of method 300 is to form one or more fin structures from semiconductor layer 208, as depicted, for example, in FIG. 9. Each fin structure acts as a transistor body. Any number of fin structures may be formed in a transistor, and the fin structures may be formed in any of the previously proposed techniques using a sidewall spacer as an etch mask. For example, one fin structure may be formed from semiconductor layer 208 in any of the manners set forth in the co-pending patent application to Bryant et al. entitled "DOUBLE GATED TRANSISTOR AND METHOD OF FABRICATION," Ser. No. 09/886,823, filed Jun. 21, 2001, which is incorporated herein by reference.

Alternatively, and for the exemplary purposes of this disclosure, two fin structures may be formed from semiconductor layer 208 in the following manner. Accordingly, in the first step of forming the fin structures from semiconductor layer 208, an etch stop layer is formed on semiconductor layer 208 comprising a silicon nitride layer 224. This etch stop layer will be used throughout the fin fabrication process when needed. Next, a mandrel layer is formed. The mandrel layer preferably comprises a layer of oxide or other suitable material. As will be explained in greater detail later, the mandrel layer is a part of a sidewall image transfer which is used to define the fin structures. As such, the mandrel layer is used to form sidewall spacers, which are in turn used to define the fin structures. The mandrel layer may have a thickness of between 10 nm and 100 nm; however, such a thickness may change depending on the desired structure thickness.

The next steps are to pattern the mandrel layer, form sidewall spacers, remove the remaining mandrel layer, and pattern nitride layer 224. The mandrel layer is patterned to open the areas in which the fin structures are formed. The sidewall spacer may be formed therein using a deposition of silicon nitride. As will be shown later, the thickness of sidewall spacer will define the thickness of the fin structure. The remaining mandrel layer is selectively removed. This may be done by performing a reactive ion etch of the mandrel layer selective to the nitride sidewall spacers and nitride layer 224. Then a suitable directional etch is performed through nitride layer 224 stopping on semiconductor layer 208.

The next step is to pattern semiconductor layer 208 using the sidewall spacers as masks. This may be done using a suitable reactive ion etch that etches semiconductor layer 208, stopping on oxide layer 206. Additionally, it is generally desirable to have the width of the fin structures (i.e., the width of semiconductor layer 208 portions) narrow when compared to the gate structure length. Typically, the width should be less than one quarter of the gate structure length to give good threshold voltage control. Also, it is generally desirable that the width should be greater than 2.5 nm to avoid degraded mobility due to quantum confinement issues. As the gate structure length is generally made to minimum feature size, sidewall image transfer is used to achieve the subminimum feature size of the fin structures. Thus, as described above, the width of the sidewall spacer determines the width of the fin structure.

The final step is to remove the sidewall spacers down to nitride layer 224 caps. Optionally, the sidewall spacers may be left in place if separate, independent gate structure contacts are desirable. Thus, as depicted in FIG. 9, fin structures remain and comprise portions of semiconductor layer 208 with overlying nitride layer 224 caps. The fin structures may have opposing vertical edges that are substantially perpendicular to oxide layer 206. As described above, this completes one exemplary manner of implementing step 304 to form one or more fin structures from semiconductor layer 208.

Steps 305–318 of method 300 are identical or similar to steps 106–118 of method 100, and as such, only distinctive details will be described. In step 305 of method 300, an implantation into the fin structure may be done. This may comprise an angled implant into the exposed opposing vertical edges of semiconductor layer 208, and would serve to properly dope the fin structures.

Figure 10:
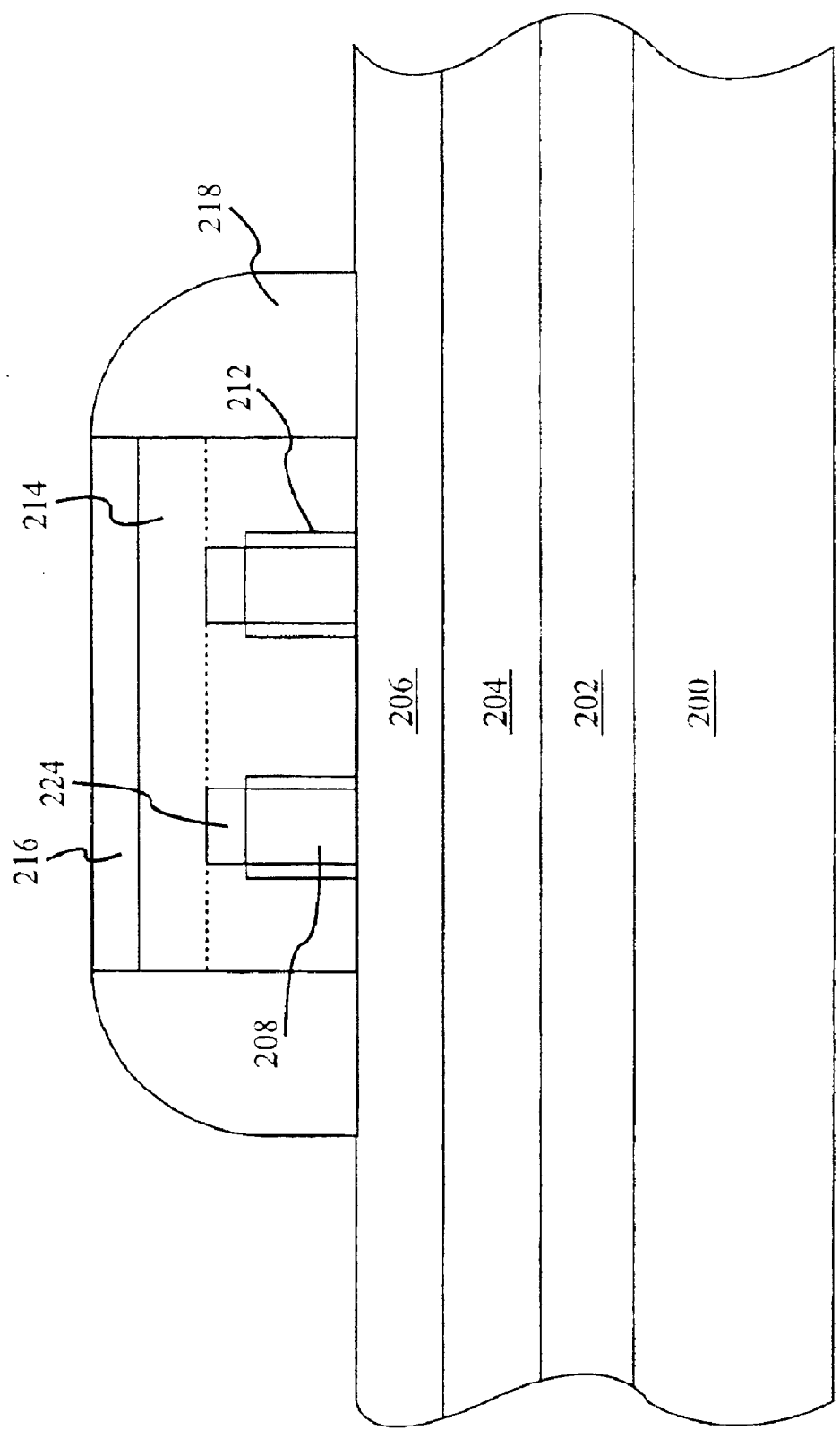
Figure 13:
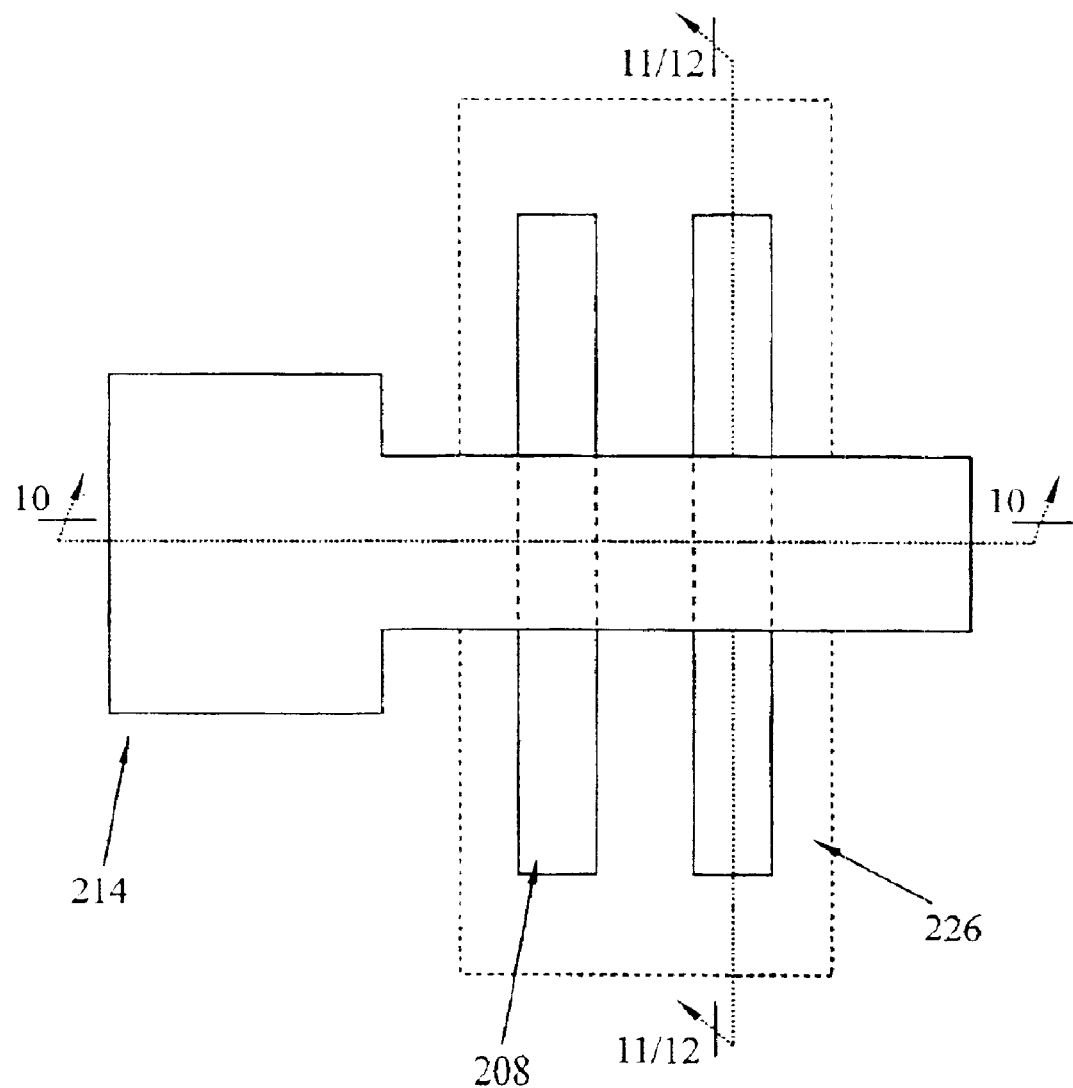
FIG. 13 is a top plan view of an embodiment of a fin transistor structure of the invention with thick recessed S/D structures.

The formation of the gate stack, including gate oxide layers 212, overlying portions of the fin structures may be illustrated from the cross-sectional view depicted in FIG. 10, which is taken along line 10—10 of FIG. 13. Next steps 306–314 of method 300 form a gate stack. Accordingly, in step 306, gate oxide layers 212 are formed on the opposing vertical edges of the semiconductor layer 208 portions of the fin structures as depicted in FIG. 10. Gate oxide layers 212 may be formed by thermal oxidation, typically at 750–800Å° C., or alternatively, may be formed by depositing a dielectric film.

Still referring to FIG. 10, step 308 of method 300 is to deposit and planarize a first portion of gate conductor layer 214 stopping on nitride layer 224 caps overlying semiconductor layer 208 portions forming the fin structures. Step 310 is to deposit a second portion of gate conductor layer 214 overlying the planarized first portion. Thus, step 308 is implemented for planarity purposes. However, step 308 may be eliminated in favor of implementing only step 310. Whether both steps 308 and 310 are implemented, or only step 310, gate structures are formed adjacent to oxide layers 212 formed on the opposing vertical edges of the fin structures.

The next step 312 of method 300 is to form and pattern nitride cap 216 (a hard mask) for patterning the gate stack. Nitride cap 216 is formed as that is the same as the already formed nitride layer 224 caps on the fin structures. Step 314 of method 300 is to pattern the gate stack. Accordingly, gate conductor layer 214 may be patterned and structured using well known photolithography and etching techniques to form the gate stack, i.e, using nitride cap 216 as an etch block during a directional etching of gate conductor layer 214. This involves selectively removing the portions of gate conductor layer 214 that exist where the adjacent S/D structures 220 and S/D regions of the transistor will be formed. The patterning removes gate conductor layer 214 down to oxide layer 206, but does not remove the portions of semiconductor layer 208 forming the fin structures that are protected by nitride layer 224 caps. Therefore, the fin structures may extend beyond the gate stack. The patterning also leaves a portion of gate conductor layer 214, which defines the gate structures adjacent the fin structures.

Figure 11:
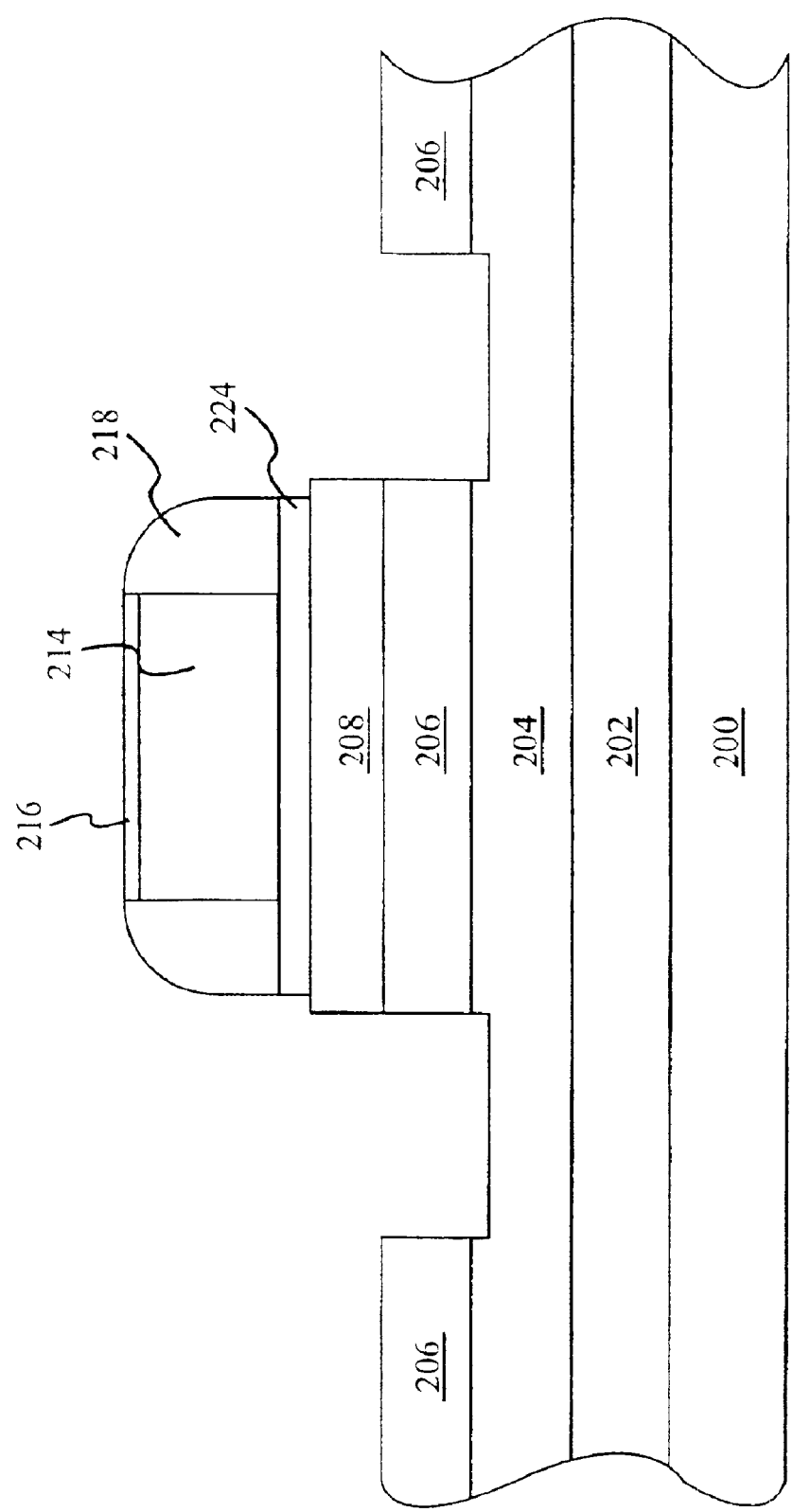

In step 316 of method 300, extension and halo implants are formed that improve short channel effects, step 316 being identical to step 116 of method 100 as previously described. In step 318 of method 300, sidewall spacers 218 may be formed, step 318 being identical to step 118 of method 100 as previously described. Furthermore, step 318 may include an isotropic etch to pull back portions of spacers 118 in order to expose the end portions of the fin structures, as depicted in FIGS. 11–12.

According to steps 320–326 of method 300, thick S/D structures 220 may be formed recessed below opposite sides of the gate stack. The formation of thick S/D structures 220 may be illustrated from the cross-sectional views depicted in FIGS. 11–12, which are taken along line 11/12 of FIG. 13. Referring particularly to FIGS. 11 and 13 and according to step 320, S/D mask 226 is applied and an etch selective to nitride is performed that etches through oxide layer 206 stopping on nitride layer 204. Nitride cap 216 protects the gate stack during this etch. In this manner, recesses for the S/D structures 220 are formed so that portions of semiconductor layer 208 forming the fin structures (i.e., transistor bodies) are situated between the recesses so that top fin structure surfaces and bottom fin structure surfaces define fin structure thicknesses. Referring particularly to FIG. 12 and according to step 122, S/D structure 220 material, such as polysilicon, is deposited and planarized with the top of the gate stack.

Figure 12:
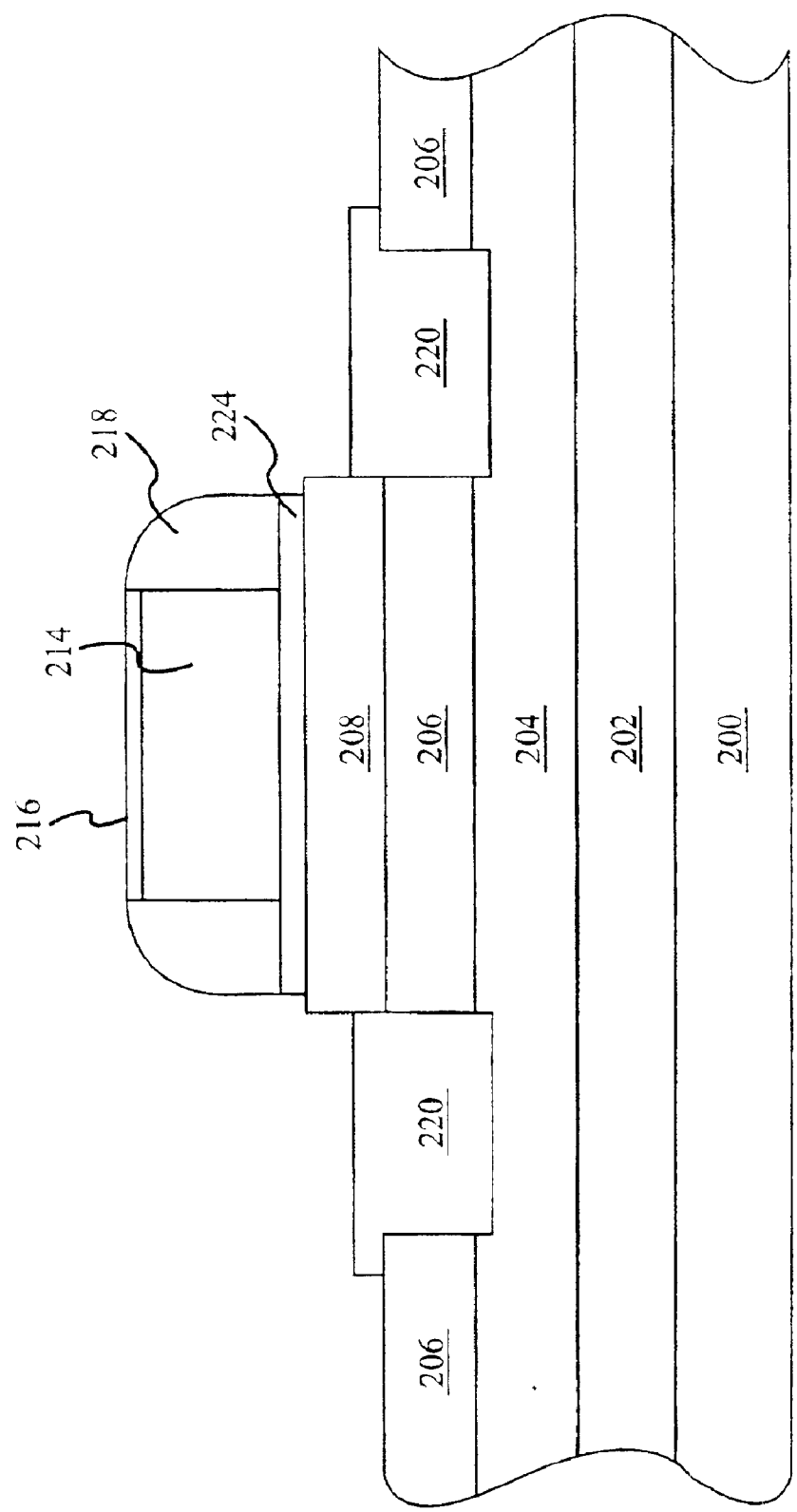

Referring particularly to FIG. 12 and according to step 322 of method 300, S/D structure 220 material is then deposited and planarized. In step 324 of method 300, S/D structure 220 material is patterned/recessed with a timed REI etch for example. In one embodiment of the invention, top portions of S/D structures 220 are recessed so that they are within and abut the fin structure thicknesses in order to make electrical connection to channel regions. In this manner (i.e., by not building up S/D structure 220 material above the fin structures), step 324 of method 300 results in decreased S/D resistance without increased gate-to-S/D capacitance, thereby increasing device operation. In contrast, conventional methods raise S/D regions on either side of the transistor resulting in increased gate-to-S/D capacitance because of the close proximity of the S/D contact to the gate (e.g. S/D silicon abutting the sides of the gate), which in turn leads to a decrease in device performance.

The next step 326 is to apply S/D mask 226 again in order to etch the S/D structure 220 material between different transistors. Thus, in FIG. 12, an embodiment of the present invention is depicted having a minimum of complexity. This depicted embodiment of the present invention is at a stage of a process flow technique modified by a fabrication method of the present invention for forming a fin transistor structure with thick recessed S/D structures 220. Particularly in this embodiment, semiconductor wafer 200 is depicted with an overlying oxide layer 202. On top of oxide layer 202 is nitride layer 204. Overlying a relevant portion of nitride layer 204 is oxide layer 206. On top of oxide layer 206 is semiconductor layer 208 portion comprising the fin structure with overlying nitride layer 224 cap. A gate stack overlies portions of the fin structure, and comprises: gate conductor layer 214 overlying nitride layer 224 cap; and nitride cap 216 overlying gate conductor layer 214. Side wall spacers 218 are also included an are adjacent to the gate stack. Recesses are formed through oxide layer 206 stopping on nitride layer 204 so that the fin structures are situated between the recesses. S/D structures 220 are formed into the recesses to facilitate lowering the S/D regions in order to decrease S/D resistance. Accordingly, top portions of S/D structures 220 are recessed so that they are within and abut the fin structure thickness.

The fin transistor structure of FIG. 12 with thick recessed S/D structures 220 may be completed according to step 328 of method 100. Accordingly, S/D regions may be formed on S/D structures 220 respectively and may define channel regions in semiconductor layer 208 portions comprising the fin structures (i.e., the transistor bodies). Formation of the S/D regions in step 328 is identical to the formation of the S/D regions in step 118 of method 100 as previously described.

Continuing with step 328, an inter metal dielectric is deposited and planarized typically using a CMP process. Contact holes are structured and etched using an anisotropic RIE process or the like. The contact holes are filled using any conducting material as previously described, thereby forming S/D contacts. Then the first metal layer is deposited and structured using a RIE process or the like. Alternatively, the structuring of the first metal layer could be done following a damascene process flow.

Transistor structures with thick recessed S/D structures according to the present invention may be used in many different kinds of circuits, such as high performance logic, low power logic or high density memory devices, including high density multi-gigabit DRAMs. The inventive transistor structures with thick recessed S/D structures may readily be combined with other elements, such as for example capacitors, resistors, diodes, memory cells and so forth.

Thus, the present invention provides transistor structures with thick recessed S/D structures and methods for forming the same that result in improved device performance and density. One embodiment of the present invention provides a SOI transistor structure with thick recessed S/D structures, while another embodiment of the present invention provides a fin transistor structure with thick recessed S/D structures.

The embodiments and examples set forth herein were presented in order to best explain the present invention and its practical application and to thereby enable those of ordinary skill in the art to make and use the invention. However, those of ordinary skill in the art will recognize that the foregoing description and examples have been presented for the purposes of illustration and example only. The description as set forth is not intended to be exhaustive or to limit the invention to the precise form disclosed. Many modifications and variations are possible in light of the teachings above without departing from the spirit and scope of the forthcoming claims. Accordingly, unless otherwise specified, any components of the present invention indicated in the drawings or herein are given as an example of possible components and not as a limitation. Similarly, unless otherwise specified, any steps or sequence of steps of the method of the present invention indicated herein are given as examples of possible steps or sequence of steps and not as limitations.

What is claimed is:

1. A transistor comprising:
   a semiconductor wafer comprising a semiconductor layer overlying a buried insulator having at least two layers;
   a first recess and a second recess through the semiconductor layer and a first layer of the buried insulator;
   a body comprising a portion of the semiconductor layer situated between the first recess and the second recess, the body comprising a top body surface and a bottom body surface that define a body thickness;
   a source structure within the first recess, the source structure comprising a source region; and
   a drain structure within the second recess, the drain structure comprising a drain region;
   wherein a top portion of the source structure and a top portion of the drain structure are within and abut the body thickness.

2. The transistor of claim 1, wherein the first layer of the buried insulator is at least as thick as the semiconductor layer.

3. The transistor of claim 1, wherein the semiconductor layer comprises single crystal silicon.

4. The transistor of claim 1, wherein the buried insulator comprises three layers, wherein a second layer is different from the first layer and a third layer.

5. The transistor of claim 4, wherein the first layer comprises silicon dioxide, wherein the second layer comprises silicon nitride, wherein the third layer comprises silicon dioxide.

6. The transistor of claim 1, wherein the first recess and the second recess stop on a second layer of the buried insulator.

7. The transistor of claim 1, wherein the body comprises a fin structure that comprises a top fin structure surface and a bottom fin structure surface that define a fin structure thickness, wherein the top portion of the source structure and the top portion of the drain structure are below said top fin structure surface, and wherein said source structure and said drain structure abut the fin structure.

8. The transistor of claim 1, wherein a first portion of the buried insulator is disposed between the first recess and the second recess.

9. The transistor of claim 1, wherein the first recess is disposed between a first portion of the buried insulator and a second portion of the buried insulator, and wherein the second recess is disposed between the first portion of the buried insulator and a third portion of the buried insulator.

10. The transistor of claim 1, wherein the semiconductor layer is in direct mechanical contact with a gate dielectric layer at a surface of the gate dielectric layer, wherein the gate dielectric layer abuts a gate conductor layer, wherein the semiconductor layer abuts the buried insulator at a surface of the buried insulator, and wherein the surface of the gate dielectric layer is about parallel to the surface of the buried insulator.

11. The semiconductor wafer of claim 1, wherein the source structure is at least as thick as a combination of the semiconductor layer and the first buried insulator layer, and wherein the drain structure is at least as thick as the combination of the semiconductor layer and the first buried insulator layer.

* * * * *